(12) United States Patent
Binnard

(10) Patent No.: US 6,445,093 B1
(45) Date of Patent: Sep. 3, 2002

(54) PLANAR MOTOR WITH LINEAR COIL ARRAYS

(75) Inventor: Michael Binnard, Belmont, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/603,844

(22) Filed: Jun. 26, 2000

(51) Int. Cl.⁷ ........................ H02K 41/00; G01N 23/00; A61N 5/00

(52) U.S. Cl. ..................... 310/12; 250/491.1; 250/492.2

(58) Field of Search ........................... 310/12, 13, 14; 250/492.1, 491.1, 492.2

(56) References Cited

U.S. PATENT DOCUMENTS

| | | |
|---|---|---|
| RE27,289 E | 2/1972 | Sawyer |
| 3,656,014 A | 4/1972 | Rich |
| RE27,436 E | 7/1972 | Sawyer |
| 3,851,196 A | 11/1974 | Hinds |
| 3,857,078 A | 12/1974 | Sawyer |
| 3,878,411 A | 4/1975 | Nocito et al. |
| 3,935,909 A | 2/1976 | Mabuchi et al. |
| 3,940,676 A | 2/1976 | Dudley |
| 3,942,054 A | 3/1976 | Kirsten et al. |
| 3,958,138 A | 5/1976 | Eastham et al. |
| 4,049,983 A | 9/1977 | Attwood et al. |
| 4,130,769 A | 12/1978 | Karube |
| 4,143,289 A | 3/1979 | Williams |
| 4,151,447 A | 4/1979 | von der Heide et al. |
| 4,317,072 A | 2/1982 | Goof et al. |

(List continued on next page.)

FOREIGN PATENT DOCUMENTS

| | | |
|---|---|---|
| JP | 62-100161 | 5/1987 |
| JP | 2-168846 | 6/1990 |
| JP | 3-178747 | 8/1991 |
| JP | 4-125055 | 4/1992 |
| JP | 7-060581 | 3/1995 |
| JP | 7-131966 | 5/1995 |
| WO | WO 98/49763 | 11/1998 |

OTHER PUBLICATIONS

Holmes, et al., "A Long–Range Scanning Stage Design (The LORS Project)," 1996 Proceedings, vol. 14, American Society for Precision Engineering, pp. 322–327, (month unknown).

Ofori–Tenkorang et al., "A Comparative Analysis of Torque Production in Halbach and Conventional Surface–Mounted Permanent–Magent Synchronous Motors," 1995 IEEE, pp. 657–663, (month unknown).

Tomita et al., "Study on a Surface–Motor Drive Precise Positioning System," Journal of Dynamic Systems, Measurement, and Control, Sep. 1995, vol. 117, pp. 311–319.

Trumber et al., "Magnet Aarrays for Synchronous Machines," (1993), IEEE, pp. 9–18.

(List continued on next page.)

*Primary Examiner*—Burton S. Mullins
(74) *Attorney, Agent, or Firm*—Finnegan Henderson Farabow Garrett & Dunner, L.L.P.

(57) ABSTRACT

A planar electric motor comprising a magnet array having a plurality of magnets with magnetic fields of alternating polarity and a coil array positioned adjacent to the magnet array and operable to interact with the magnetic fields to generate an electromagnetic force between the coil array and the magnet array. The coil array comprises a first linear coil array having a plurality of oval shaped coils extending longitudinally in a first direction, and a second linear coil array having a plurality of oval shaped coils extending longitudinally in a second direction generally orthogonal to the first direction. The motor is for use in moving a stage within an exposure apparatus having an optical system for imaging a pattern formed in a reticle onto an article supported by the stage.

27 Claims, 6 Drawing Sheets

U.S. PATENT DOCUMENTS

| | | |
|---|---|---|
| 4,336,475 A | 6/1982 | Morinaga et al. |
| 4,369,383 A | 1/1983 | Langley |
| 4,385,248 A | 5/1983 | Laskaris |
| 4,393,344 A | 7/1983 | Whellams |
| 4,445,061 A | 4/1984 | Jackson |
| 4,463,276 A | 7/1984 | Nakamura |
| 4,485,339 A | 11/1984 | Trost |
| 4,535,278 A | 8/1985 | Asakawa |
| 4,547,713 A | 10/1985 | Langley et al. |
| 4,551,645 A | 11/1985 | Takahahi et al. |
| 4,555,650 A | 11/1985 | Asakawa |
| 4,563,808 A | 1/1986 | Lender |
| 4,607,167 A | 8/1986 | Petric |
| 4,626,749 A | 12/1986 | Asakawa |
| 4,645,961 A | 2/1987 | Malsky |
| 4,654,571 A | 3/1987 | Hinds |
| 4,667,123 A | 5/1987 | Denk et al. |
| 4,692,631 A | 9/1987 | Dahl |
| 4,705,956 A | 11/1987 | Ward |
| 4,706,007 A | 11/1987 | Nagasaka |
| 4,714,851 A | 12/1987 | Bertram |
| 4,733,118 A | 3/1988 | Mihalko |
| 4,734,603 A | 3/1988 | von der Heide et al. |
| 4,742,286 A | 5/1988 | Phillips |
| 4,758,750 A | 7/1988 | Itagaki et al. |
| 4,767,954 A | 8/1988 | Phillips |
| 4,786,832 A | 11/1988 | Nakagawa et al. |
| 4,794,284 A | 12/1988 | Buon |
| 4,912,746 A | 3/1990 | Oishi |
| 4,937,485 A | 6/1990 | Mihalko |
| 4,952,858 A | 8/1990 | Galburt |
| 4,958,115 A | 9/1990 | Miller |
| 5,015,622 A | 5/1991 | Ward et al. |
| 5,083,905 A | 1/1992 | Mohn |
| 5,126,648 A | 6/1992 | Jacobs |
| 5,179,305 A | 1/1993 | Van Engelen |
| 5,189,268 A | 2/1993 | Pavoz et al. |
| 5,196,745 A | 3/1993 | Trumper |
| 5,208,497 A | 5/1993 | Ishii et al. |
| 5,294,854 A | 3/1994 | Trumper |
| 5,309,049 A | 5/1994 | Kawada et al. |
| 5,319,336 A | 6/1994 | Alcon |
| 5,327,060 A | 7/1994 | Van Engelen et al. |
| 5,334,892 A | 8/1994 | Chitayat |
| 5,352,946 A | 10/1994 | Hoffman et al. |
| 5,357,158 A | 10/1994 | Takei |
| 5,360,470 A | 11/1994 | Hoffman et al. |
| 5,399,930 A | 3/1995 | Culp |
| 5,416,396 A | 5/1995 | Takei |
| 5,477,304 A | 12/1995 | Nishi |
| 5,504,407 A | 4/1996 | Wakui et al. |
| 5,519,266 A | 5/1996 | Chitayat |
| 5,528,118 A | 6/1996 | Lee |
| 5,574,556 A | 11/1996 | Mori et al. |
| 5,623,853 A | 4/1997 | Novak et al. |
| 5,666,038 A | 9/1997 | Ohishi |
| 5,715,037 A | 2/1998 | Saiki et al. |
| 5,723,929 A | 3/1998 | Niimi |
| 5,773,837 A | 6/1998 | Nakasuji |
| 5,886,432 A * | 3/1999 | Markle ..................... 310/12 |
| 5,925,956 A | 7/1999 | Ohzeki |
| 6,097,114 A | 8/2000 | Hazelton |
| 6,188,147 B1 * | 2/2001 | Hazelton et al. .............. 310/12 |

OTHER PUBLICATIONS

Trumper et al., "Control and Actuator Design for a Precision Magnetic Suspension Linear Bearing," SPIE, vol. 1696 Controls for Optical systems (1992), pp. 2–15, (month unknown).

Trumper et al., "Design and Analysis Framework for Linear Permanent Magnet Machines" (1994) IEEE, pp. 216–223.

Williams et al., "Magnetic Bearing Stage for Photolithography," Annals of the CIRP, vol. 42/1993, pp. 607–610, (month unknown).

* cited by examiner

PLANAR MOTOR WITH LINEAR COIL ARRAYS

FIELD OF THE INVENTION

This invention relates generally to electric motors, and more particularly, to high precision motors for use in lithography systems.

BACKGROUND OF THE INVENTION

Many precision systems, such as those used in semiconductor manufacturing, use linear or planar motors for positioning objects such as semiconductor wafers. Conventional planar motors are disclosed in U.S. Pat. Nos. 3,851,196, 4,654,571, 5,196,745, and 5,334,892. These patents describe planar motors which have significant limitations. For example, the planar motor of the '196 patent has a limited range of motion since each motor portion of the stationary magnet array can only generate force in a single direction. Thus, each coil array must always be located above the corresponding magnet array. This limits the range of movement for a given size actuator. The motor disclosed in the '745 patent similarly requires that each coil array is located above a corresponding linear magnet array. The motor of the '571 patent includes a coil design which generates only a limited amount of force due to the layout of the coils on the stage. In addition, the design does not generate force in six degrees of freedom. The '892 patent discloses a planar motor which permits a wide range of motion, but only in a single plane.

Conventional technology also relies upon cumbersome stacked arrangements to achieve six degrees of freedom of movement. These stacked arrangements have a number of drawbacks including additional power requirements, and reduced positioning accuracy. Motors which eliminate stacked arrangements and provide six degrees of freedom over a full range of movement of the wafer stage with a single planar motor typically require large magnet and coil arrays to provide the force required. This results in an increase in mass of the stage and system, thus reducing the natural frequency of the system and degrading performance.

Furthermore, conventional systems often include complex coil geometry which increases the size of the motor and may increase the stage mass, thus increasing power requirements. The complex geometry of the coils often prevents close packing of the coils, which further increases the size of the motor and decreases efficiency. The coil arrays also require a large number of individual coils and amplifiers and complex control electronics to energize the coils and drive the motor.

There is, therefore, a need for a compact motor with a non-complex coil array having closely packed coils, which provides six degrees of freedom with high speed and precision and energy efficient operation.

SUMMARY OF THE INVENTION

The present invention overcomes the deficiencies of the prior art by providing a compact motor with a simplified coil geometry which provides six degrees of freedom and energy efficient operation.

The present invention is directed to a planar motor comprising a magnet array having a plurality of magnets with magnetic fields of alternating polarity and a coil array positioned adjacent to the magnet array and operable to interact with the magnetic fields to generate an electromagnetic force between the coil array and the magnet array. The coil array comprises a first linear coil array having a plurality of oval shaped coils extending longitudinally in a first direction, and a second linear coil array having a plurality of oval shaped coils extending longitudinally in a second direction generally orthogonal to the first direction.

The magnets may have a rectangular or octagonal cross-sectional shape, for example. The magnets may be arranged in a checkerboard pattern with alternating magnetic poles along a row or column, or the magnets in one row may have the same polarity with magnets in an adjacent row having oppositely directed polarity, for example.

An exposure apparatus of the present invention generally comprises a frame, an optical system mounted on the frame for imaging a pattern formed in a reticle onto an article, and a base positioned below the optical system. A stage for supporting the article is positioned adjacent to the base. The apparatus further comprises an electric motor operable to move the stage. The motor comprises a magnet array having a plurality of magnets with magnetic fields of alternating polarity, and a coil array positioned adjacent to the magnet array and operable to interact with the magnetic fields to generate an electromagnetic force between the coil array and the magnet array. The coil array includes a first linear coil array having a plurality of oval shaped coils extending longitudinally in a first direction, and a second linear coil array having a plurality of oval shaped coils extending longitudinally in a second direction generally orthogonal to said first direction. One of the coil array and the magnet array is connected to the stage for movement therewith relative to the other of the magnet array and the coil array which is connected to the base.

The above is a brief description of some deficiencies in the prior art and advantages of the present invention. Other features, advantages, and embodiments of the invention will be apparent to those skilled in the art from the following description, drawings, and claims.

BRIEF DESCRIPTION OF THE DRAWINGS

FIG. 2b is a graphical representation of an electromagnetic force component of the electric motor of FIG. 2a;

FIG. 3a is a schematic of the electric motor of FIG. 2a with the coil array moved relative to the magnet array from its position in FIG. 2a;

FIG. 3b is a graphical representation of an electromagnetic force component of the electric motor of FIG. 3a;

Corresponding reference characters indicate corresponding parts throughout the several views of the drawings.

DESCRIPTION OF THE INVENTION

Figure 1:
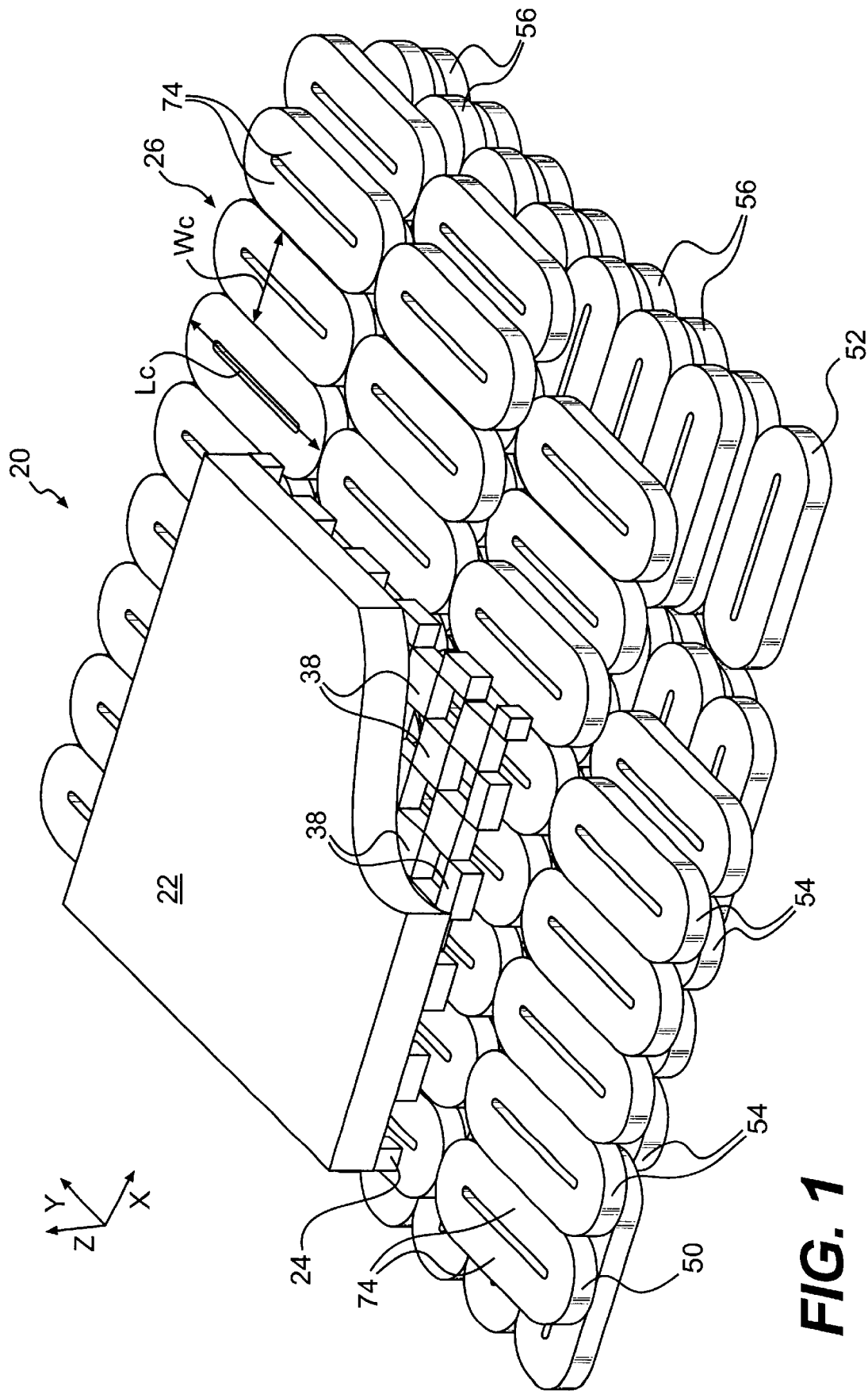
FIG. 1 is a perspective of an electric motor of the present invention with a magnet array attached to a stage and positioned over a coil array of the electric motor, parts being broken away to show detail.

Referring now to the drawings, and first to FIG. 1, an electric motor of the present invention, generally indicated at 20, is shown with a stage 22 attached to the motor for positioning a semiconductor wafer (not shown) during a photolithography process. The electric motor 20 may also be used to position a reticle during semiconductor processing or in other types of positioning systems for processing articles other than semiconductor wafers. The electric motor 20 is a planar motor comprising a magnet array 24 and a coil array, generally indicated at 26. The motor 20 uses electromagnetic force (Lorentz force) to propel the stage 22. The magnet array 24 is positioned adjacent to the coil array 26 and provides permanent magnetic fields which interact with a current distribution of the coil array to cause a force between the magnet array and the coil array. The interaction of the magnetic fields and the current distribution permits either the magnet array 24 or the coil array 26 to move with respect to the other in at least three degrees of freedom and preferably six degrees of freedom. For example, currents in the coil array 26 may interact with magnetic fields from the magnet array 24 to cause a force in the x, y, and z directions, and torque about the x, y, and z axes. This interaction, and the general operation of a planar motor is described in U.S. patent application Ser. Nos. 09/192,813, by A. Hazelton et al., filed Nov. 16, 1998 and Ser. No. 09/135,624, by A. Hazelton, filed Aug. 17, 1998, the entirety of which are incorporated herein by reference.

As shown in FIG. 1, the magnet array 24 is attached to the stage 22 and is free to move with the stage relative to the coil array 26 which is in a stationary position. This moving magnet embodiment is preferred over a moving coil arrangement when used in positioning devices, because the magnet array 24 does not require electrical current connections. In addition, when coil cooling is required, cooling hoses (not shown) must be attached to the coil array 26. The electrical connections and cooling hoses may interfere with movement of the coil array 26. However, the coil array 26 may be attached to the stage 22 and movable relative to a fixed magnet array for other applications.

Figure 2A:
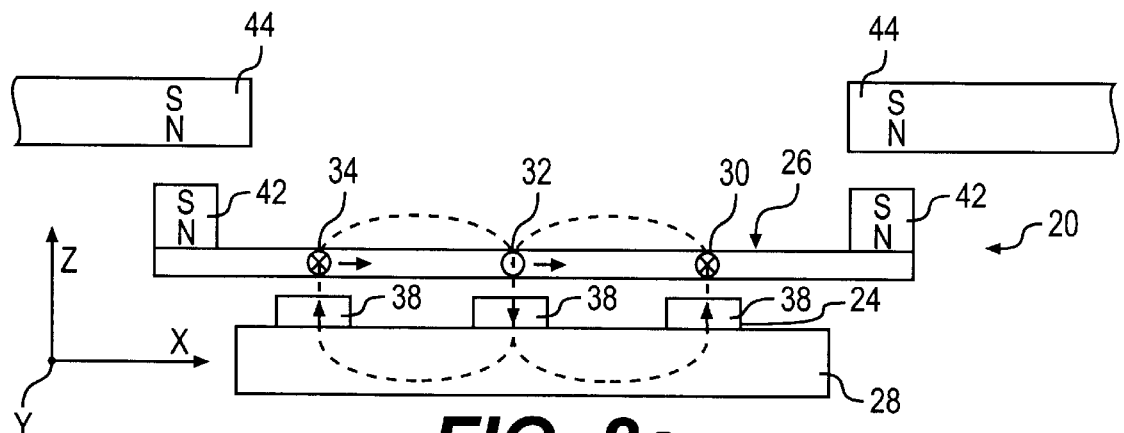
FIG. 2a is a schematic of an electric motor of the present invention showing the interaction of the magnet array and the coil array.

Referring now to FIGS. 2a–3b, the interaction of the coil array 26 and the magnet array 24 is described, and more specifically commutations of the coil array to provide motion in the x, y, and z directions, torque about the x and y axes, and rotational motion about the z axis are described. FIGS. 2a–3b show a moving coil embodiment of the motor 20, however, the following description is also applicable to the moving magnet embodiment described above. The magnet array 24 includes a plurality of magnets 38 (three shown) mounted on a magnetic plate 28. The magnets 38 alternate in polarity in the z direction. The coil array 26 is shown positioned above the magnet array 24 and is schematically shown as consisting of three wires 30, 32, 34 connected to a single-phase source of electric current. For purposes of clarity, only three coil wires are shown in FIGS. 2a and 3a. As is well known by those skilled in the art, the coil array 26 may include numerous closely packed wires connected with a commutation circuit in multiple phases (e.g., two or three), with each phase having a plurality of wires. Preferably, only two phases are used for the motor 20 to reduce the number of coils and amplifiers, as further described below.

The wires 30, 32, 34 are located directly above the magnets 38 of the magnet array 24. A commutation circuit (not shown) controls and supplies electric current to the wires 30, 32, 34. A solid dot on a wire indicates electric current flowing in the -y direction out of the plane of the drawing and an x on the wire indicates electric current flowing in the +y direction into the plane of the drawing. As shown in FIG. 2a, electric current on the wires 30 and 34 flows into the plane of the drawing and the electric current on the wire 32 flows out of the plane of the drawing. Dashed lines indicate the magnetic flux path of the magnet array 24 and arrows on the magnets 38 indicate the magnetic polarity. According to the Lorentz law, an electromagnetic force acts on the coil array 26 exclusively in the +x direction. An equal but oppositely directed electromagnetic force acting on the magnet array 24 balances each electromagnetic force component acting on the coil array 26. As the wires 30, 32, 34 of the coil array 26 move laterally relative to the magnets 38 of the magnet array 24, an electric current distribution Ix eventually drops to zero.

Figure 2B:
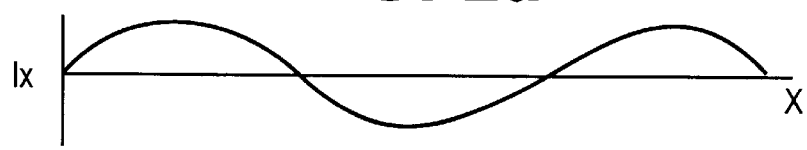

FIG. 2b shows the current distribution Ix as a function of the position of the coil array 26 along the x axis. The electric current Ix is applied to achieve forces and motion of the coil array 26 relative to the magnet array 24 in the x direction. The electric current Ix is typically supplied by the commutation circuit as a sinusoidal waveform, as shown graphically in FIG. 2b in alignment with the planar motor of FIG. 2a.

Figure 3A:
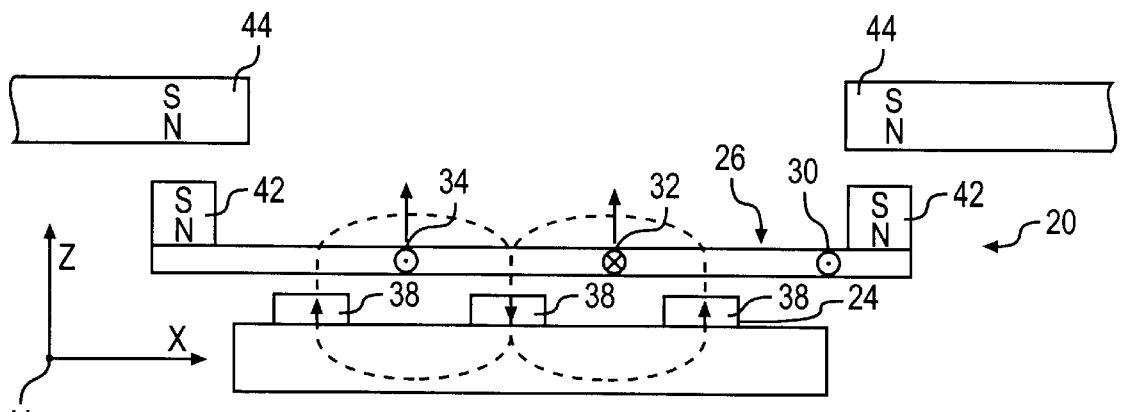
Figure 3B:
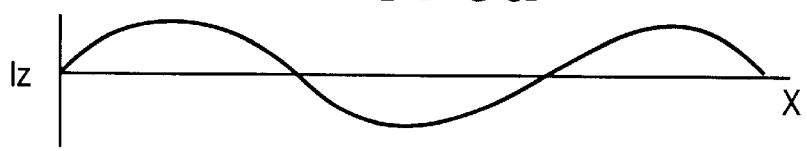

FIG. 3a shows the motor 20 of FIG. 2a at a later point in time after the coil array 26 has been propelled along the x direction a distance equal to approximately half the distance between adjacent wires 32, 34. The wires 32, 34 are now positioned midway between respective magnets 38. The commutation circuit provides electric current flowing in the -y direction out of the plane of the drawing in the wires 30 and 34 and in the +y direction into the plane of the drawing in the wire 32. In accordance with the Lorentz law, the resultant electromagnetic force acts on the coil array 26 exclusively in the +z direction. The z direction force acts to urge the coil array 26 upward away from the magnet array 24. The magnitude of the electric current adjusts the altitude of the coil array 26 above the magnet array 24. The angular inclination of the coil array 26 relative to the magnet array 24 may be adjusted by supplying currents of differing magnitudes through different wires. For example, providing a stronger current to the wire 32 than to the wire 34 causes the right hand side (as viewed in FIG. 3a) of the coil array 26 to raise higher relative to the left hand side of the coil array above the magnet array 24. This provides rotation of the coil array 26 about the y axis. A sinusoidal shaped waveform, as shown graphically in FIG. 3b in alignment with the planar motor 20 of FIG. 3a, causes electric current Iz to fall eventually to zero when the wires 30, 32, 34 move farther to the right relative to the respective magnets 38.

As shown on the wire 34 in FIGS. 2a and 3a, the Lorentz force has an z component which urges the coil array 26 away from the magnet array 24, and an x component, which urges the coil array in the x direction. When only x force is desired, the z direction force components are cancelled by an opposing z force component on a wire commutated by a different phase and having either a magnetic flux or current reversed relative to the wire 34, so that only the x direction force remains.

Levitation magnets 42, 44 may be used to help suspend the coil array 26 (FIG. 3a) (or magnet array 24). The magnets 42, 44 may also be used to augment z force commutation as a means for suspending the stage 22, thus reducing the electric current needed to generate z direction force for suspension of the stage.

A few examples of commutation have been described. As will be appreciated by those skilled in the art, many other commutations may be applied to the coils to achieve force and motion in the x, y, and z directions and torque and rotation about the x, y, and z axes. Clearly, other portions of the coil array may be similarly commutated by currents and current distributions as illustrated in FIGS. 2a–3b to produce differing magnitudes of x and z forces on different portions of the electric motor 20. Since these various portions of the motor 20 are separated by distances in the x and y directions, rotational force about the z direction and y direction and linear force in the x and z directions can be produced. An identical analysis of forces acting upon coils distributed in the y direction provides rotational force about the x direction and z direction and linear force in the y and z directions. Thus, six degree of freedom of motion for the electric motor 20 is achieved.

As shown in FIG. 1, the coil array comprises an x linear coil array 50 for moving the stage along the x axis and a y linear coil array 52 for moving the stage along the y axis. In order to provide force to the stage 22 in the x direction relative to the coil array 26, two phase commutated electric current is supplied to the x-coil array 50 in a conventional manner by a commutation circuit and current source (not shown) (FIGS. 1 and 2). In order to provide force to the stage 22 in the y direction, two phase commutated electric current is supplied to the y-coil array 52 by respective commutation circuits and current source. To provide rotation of the stage 22 relative to the coil array 26 in an xy plane parallel to the x and y axes, commutated electric current is supplied individually to coils 54 within the x-coil array 50 or coils 56 within the y-coil array 52. Alternatively, electric current may be supplied to all coils 54, 56 of either the x coil or y-coil array 50, 52, respectively, but with opposite polarities, providing force to some of the coils in one direction and the other coils in an opposite direction, thereby generating a torque about the z axis. The commutation circuits and the current sources are controlled by conventional motor controllers (not shown) providing logic signals for directing movement of the motor 20. Other commutation configurations may be used. For example three or multiphase commutated electric current may also be used.

The x-coil array 50 is oriented so that the coils 54 extend longitudinally in a direction perpendicular to the x axis and the y-coil array 52 is oriented so that the coils 56 extend longitudinally in a direction perpendicular to the y axis. Coils 54 are arranged to provide the x-direction propulsion and the coils 56 are arranged to provide the y-direction propulsion. To generate force in the y direction, the coils 56 located directly under the magnet array 24 and the stage 22 are energized. Similarly, to generate force in the x direction, the coils 54 located directly under the magnet array 24 and the stage 22 are energized. To provide rotation parallel to the xy plane, some coils 54, 56 in either the x or y coil arrays 50, 52 or both the x and y coil arrays are selectively energized.

The x-coil array 50 and the y-coil array 52 each include a plurality of coils 54, 56, respectively. As shown in FIG. 1, the coils 54, 56 are wound in a generally oval shape. The coils 54, 56 are formed from a plurality of closely wound copper wires (not shown) preferably having a circular or rectangular cross-sectional shape. The oval coils 54, 56 may also be formed using laminated flex-circuit technology, for example. A laminated flex-circuit is formed by laminating together layers of flexible circuit board. Each layer of the lamination includes an insulating material (preferably polyimide) and a conductive material (preferably copper). The layers may be formed by depositing copper on a polyimide substrate, for example. Each layer includes a single turn of the conductive material or a spiral pattern which contains several turns of the conductive material. A hole is formed in the insulating material to allow electrical connection between adjacent layers.

The oval coils 54, 56 are generally flat with substantially planar upper and lower surfaces. This allows the coils 54, 56 to be closely packed with no spacing therebetween. The oval coils 54, 56 are formed with opposing legs 74 disposed generally adjacent one another so that there is only a narrow slit extending through the coil. This provides a generally continuous planar upper surface and lower surface. A ratio of the length Lc of the coil 54, 56 to the width Wc of the coil is preferably at least about 2.0, and more preferably at least about 2.5. The x and y coils 54, 56 are preferably the same size and shape, however, they may differ from one another. For example, the x-coils 54, y-coils 56, or both the x and y coils may have an oval shape with the legs 74 spaced apart to form a central opening in the coil (not shown).

The x and y coil arrays 50, 52 are each formed by positioning the coils 54, 56 in a laterally abutting arrangement to form a row and positioning the rows immediately adjacent one another to form the array. The x-linear coil array 50 is then stacked on the y-linear coil array 52 vertically in the z direction (perpendicular to the x and y axes (FIG. 1). The x and y coil arrays 50, 52 each include two stacked rows of coils 54, 56. The two stacked layers of coils 54, 56 in each coil array 50, 52 are provided for a two phase motor (i.e., a layer of coils is provided for each phase). The horizontal spacing between each layer is Wc/(2× (number of phases)). Thus, preferably only two phases are used to reduce the number of coils and amplifiers.

It is to be understood that the coil array 26 may be arranged differently than shown herein without departing from the scope of the invention. For example, the x and y coil arrays 50, 52 may also be arranged in a checkerboard pattern with a plurality of square x and y coil arrays 50, 52 arranged adjacent one another in a single layer rather than stacked on top of one another. In a checkerboard arrangement, alternating squares contain orthogonally oriented x and y coils 54, 56.

The x and y coil arrays 50, 52 may be mounted on a magnetically permeable panel (not shown) formed from a material such as iron. The magnetically permeable panel increases the permanent magnetic flux through the coils 54, 56 and thus improves the motor 20 performance.

Figure 4:
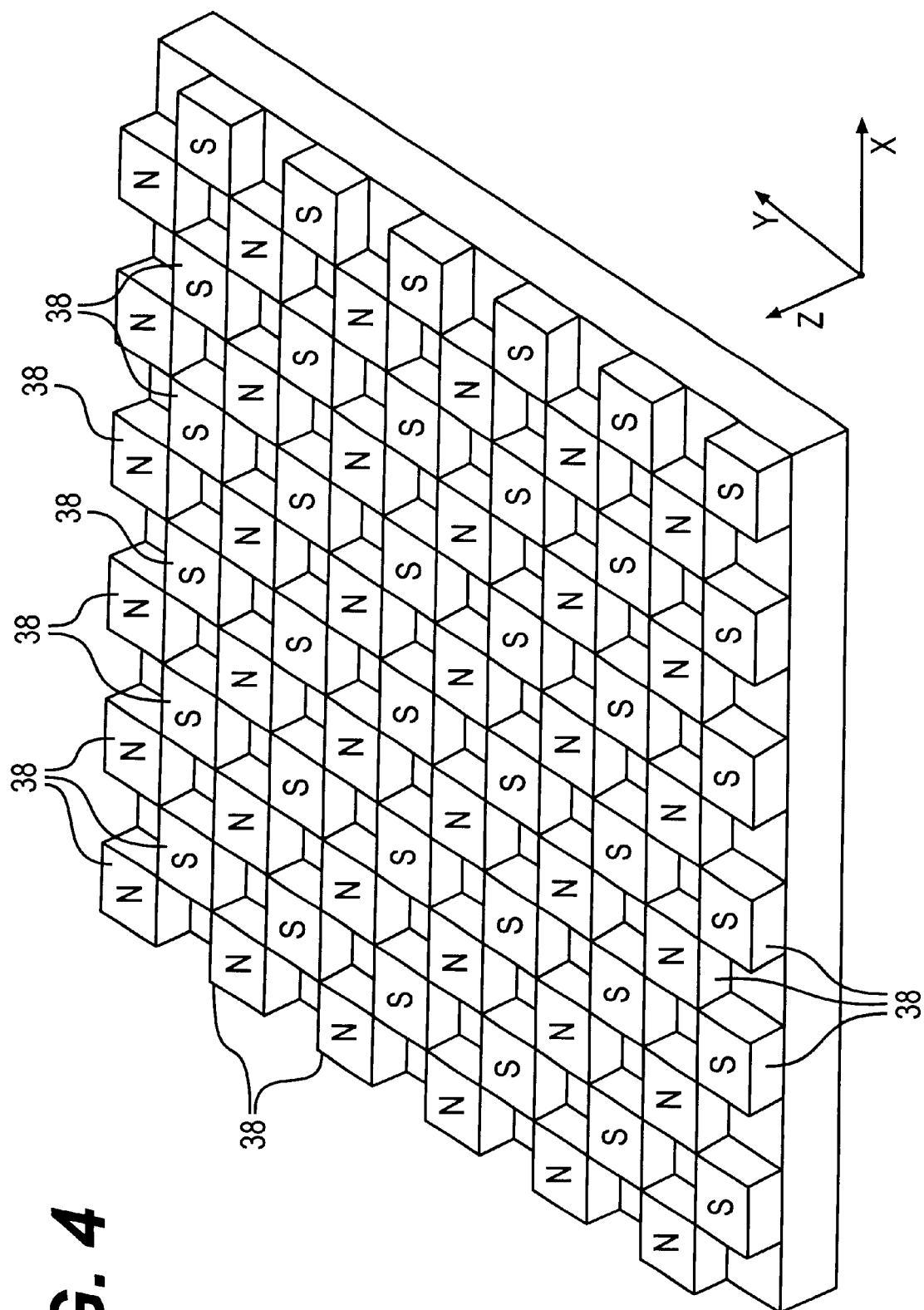
FIG. 4 is a perspective of the magnet array of FIG. 1.

A first embodiment of the magnet array 24 is shown in FIG. 4. The magnet array includes a plurality of the magnets 38 distributed in a first direction along the x-axis and in a second direction along the y-axis to form a two-dimensional magnet array. The magnets 38 are aligned in the two directions along the x and y axes in a staggered checkerboard arrangement. The poles of the magnets 38 are directed along the z axis either into or out of the plane of the drawing (i.e., north or south). The magnets 38 alternate in polarity in rows and columns. For example, one row has all north magnets 38 and the adjacent row has all south magnets. It is to be understood that the arrangement of magnets 38 and types of magnets may be different than shown herein without departing from the scope of the invention. For example, the magnets 38 may be aligned immediately adjacent to one another with no spacing in between and alternate in pole directions along each row or column. If the magnets are disposed immediately adjacent one another, the magnet array is preferably oriented at a 45 degree angle relative to the x and y coils 54, 56.

Figure 5:
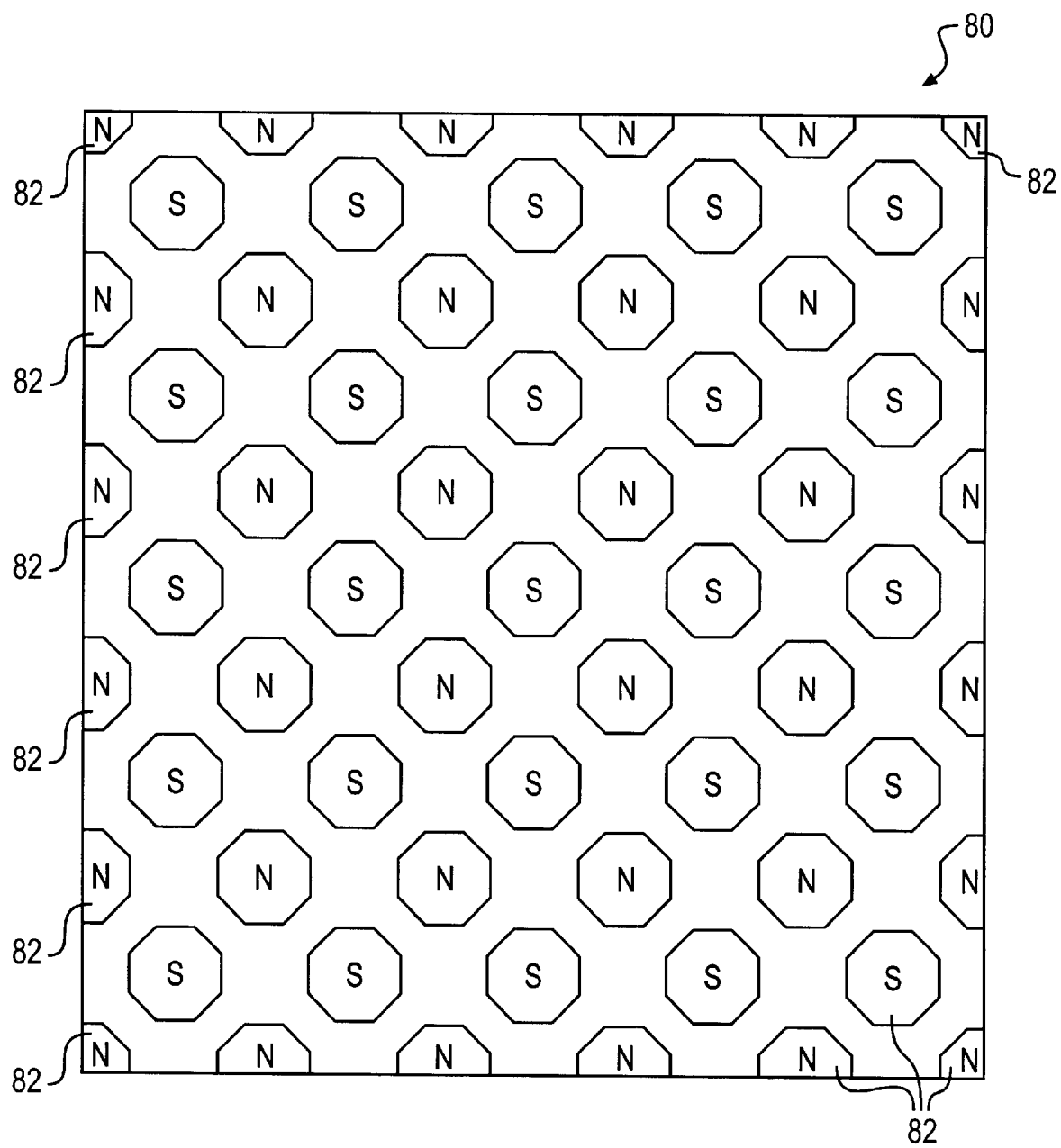
FIG. 5 is a plan view of a second embodiment of the magnet array of FIG. 4.

A second embodiment of the magnet array is shown in FIG. 5 and generally indicated at 80. The magnet array 80 comprises a plurality of octagonal shaped magnets 82 which are distributed in two directions. The magnets 82 are evenly spaced from one another and alternate in polarity between adjacent rows and columns.

Figure 6:
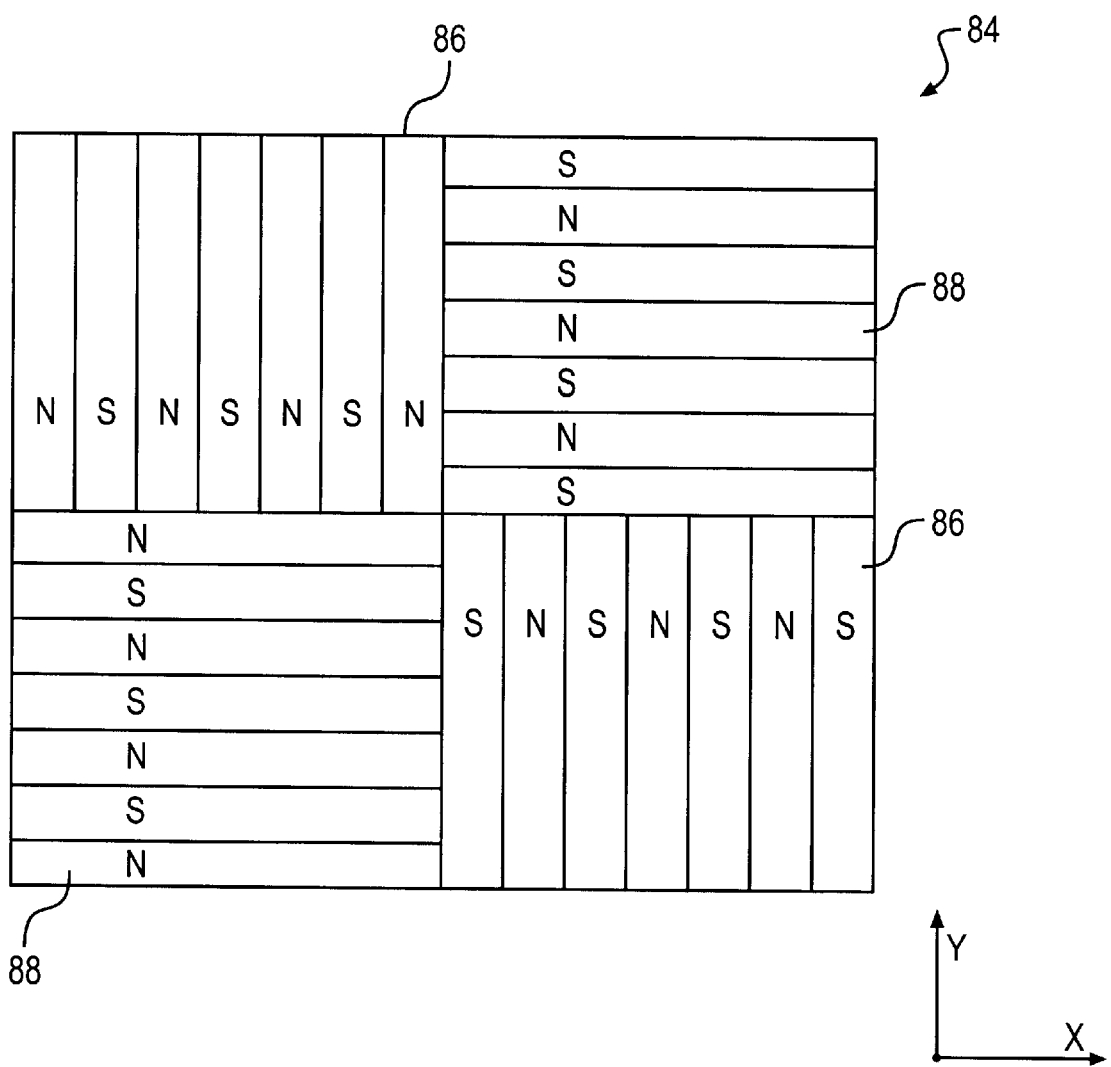
FIG. 6 is a plan view of a third embodiment of the magnet array of FIG. 4.

FIG. 6 shows a third embodiment of the magnet array, generally indicated at 84. The magnet array 84 comprises two linear magnet sets 86 having rectangular magnets aligned parallel to the y axis and two linear magnet sets 88 having rectangular magnets aligned parallel to the x axis (orthogonal to the y axis).

The magnet array may also comprise transverse and wedge magnets as described in U.S. patent application Ser. No. 09/168,694, by Hazelton et al., filed Oct. 5, 1998, for example.

Figure 7:
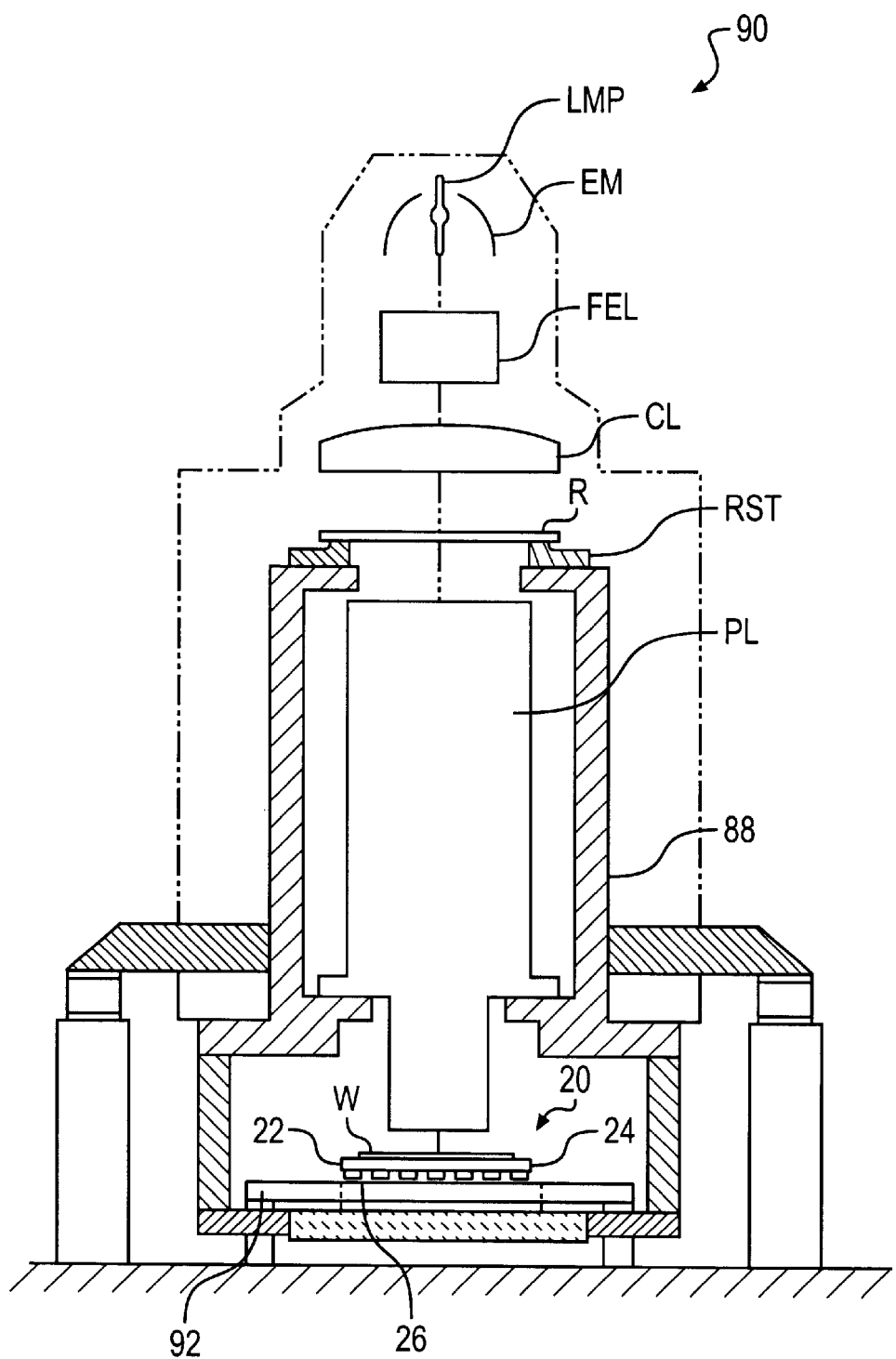
FIG. 7 is a schematic of an exposure apparatus using the electric motor of FIG. 1.

FIG. 7 schematically illustrates an example of an exposure apparatus, generally indicated at 90, using the planar motor 20 of the present invention. The exposure apparatus generally comprises a frame 88, an optical system, the motor 20, and the stage 22 for supporting and positioning a wafer W. The optical system is mounted on the frame 88 above a base 92. The base 92 is shown connected to the frame 88, however, it may also be attached to a separate frame. The coil array 26 is mounted on an upper surface of the base 92. The magnet array 24 is connected to a lower surface of the stage 22 and is movable relative to the coil array 26 and the optical system. The optical system projects light through a mask pattern (e.g., circuit pattern for a semiconductor device) formed in a reticle R which is supported and scanned using a reticle stage RST. The optical system includes an illuminator having a lamp LMP and an ellipsoid mirror EM surrounding the lamp. The illuminator comprises an optical integrator FEL for producing secondary light source images and a condenser lens CL for illuminating the reticle R with uniformed light flux. A projection lens PL focuses the light onto the wafer W. The wafer W is positioned under the projection lens PL and preferably held by vacuum suction on a wafer holder (not shown) which is supported by the wafer stage 22. In operation, light beams from the illuminator pass through the reticle R and expose photoresist on the wafer W, which is supported and scanned using the stage 22 driven by the motor 20. Further details of the components of the exposure apparatus 90 may be referenced from U.S. Pat. No. 5,528,118, by M. Lee, for example. It is to be understood that the present invention is not limited to the exposure apparatus 90 described herein or to exposure systems for wafer processing. The general reference to the exposure apparatus 90 is purely for illustrating an embodiment of an environment in which the invention may be used.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A planar electric motor comprising:
  a magnet array having a plurality of magnets with magnetic fields of alternating polarity; and
  a coil array positioned adjacent to the magnet array and operable to interact with said magnetic fields to generate an electromagnetic force between the coil array and the magnet array, the coil array comprising a first coil array having a plurality of oval shaped coils extending longitudinally in a first direction, and a second coil array having a plurality of oval shaped coils extending longitudinally in a second direction generally orthogonal to said first direction,
  wherein said first coil array is stacked on top of the second coil array and each of said first and second coil arrays includes a plurality of stacked layers of said oval shaped coils, and
  wherein each of said plurality of oval shaped coils has a length to width ratio of at least 2.

2. The electric motor of claim 1, wherein each of said plurality of oval shaped coils has a continuous planar upper surface and a continuous planar lower surface generally parallel to the upper surface.

3. The electric motor of claim 1, wherein the oval shaped coils are positioned in a laterally abutting arrangement to form a plurality of rows of coils.

4. The electric motor of claim 3 wherein the rows of coils are positioned immediately adjacent one another.

5. The electric motor of claim 1, wherein the oval shaped coils of the first coil array are the same shape and size as the oval shaped coils of the second coil array.

6. The electric motor of claim 1 wherein said magnetic fields of the magnets alternate in adjacent rows and columns.

7. The electric motor of claim 6 wherein the magnets are spaced from one another along two dimensions of the magnet array.

8. The electric motor of claim 7 wherein each of said plurality of magnets has a rectangular cross-sectional shape.

9. The electric motor of claim 7 wherein each of said plurality of magnets has an octagonal cross-sectional shape.

10. The electric motor of claim 1 wherein the magnet array and coil array are operable to provide the force in first, second, and third directions, the first and second directions being generally orthogonal to one another and the third direction being generally orthogonal to the first and second directions.

11. The electric motor of claim 10 wherein the magnet array and coil array are operable to provide a torque between the coil array and the magnet array about the third direction.

12. The electric motor of claim 11 wherein the magnet array and the coil array are operable to provide a torque between the coil array and the magnet array about the first and second directions.

13. An exposure apparatus comprising:
  a frame;
  an optical system for forming an image on an article, the optical system being mounted on the frame;
  a base positioned below the optical system;
  a stage positioned adjacent to the base for supporting and positioning the article, the stage being movable relative to the base and the optical system; and
  an electric motor operable to move the stage, the motor comprising a magnet array having a plurality of magnets with magnetic fields of alternating polarity, and a coil array positioned adjacent to the magnet array and operable to interact with said magnetic fields to generate an electromagnetic force between the coil array and the magnet array, the coil array comprising a first coil array having a plurality of oval shaped coils extending longitudinally in a first direction, and a second coil array having a plurality of oval shaped coils extending longitudinally in a second direction generally orthogonal to said first direction, one of the coil array and the magnet array being connected to the stage for movement therewith relative to the other of the magnet array and the coil array connected to the base,
  wherein said first coil array is stacked on top of the second coil array and each of said first and second coil arrays includes a plurality of stacked layers of said oval shaped coils, and
  wherein each of said plurality of oval shaped coils has a length to width ratio of at least 2.

14. The exposure apparatus of claim 13, wherein each of said plurality of oval shaped coils has a continuous planar upper surface and a continuous planar lower surface generally parallel to the upper surface.

15. The exposure apparatus of claim 13, wherein the oval shaped coils are positioned in a laterally abutting arrangement to form a plurality of rows of coils.

16. The exposure apparatus of claim 15 wherein the rows of coils are positioned immediately adjacent one another.

17. The exposure apparatus of claim 13, wherein the oval shaped coils of the first coil array are the same shape and size as the oval shaped coils of the second coil array.

18. The exposure apparatus of claim 13 wherein said magnetic fields of the magnets alternate in adjacent rows and columns.

19. The exposure apparatus of claim 18 wherein the magnets are spaced from one another along two dimensions of the magnet array.

20. The exposure apparatus of claim 19 wherein each of said plurality of magnets has a rectangular cross-sectional shape.

21. The exposure apparatus of claim 19 wherein each of said plurality of magnets has an octagonal cross-sectional shape.

22. The exposure apparatus of claim 13 wherein the magnet array and coil array are operable to provide the force in first, second, and third directions, the first and second directions being generally orthogonal to one another and the third direction being generally orthogonal to the first and second directions.

23. The exposure apparatus of claim 22 wherein the magnet array and coil array are operable to provide a torque between the coil array and the magnet array about the third direction.

24. The exposure apparatus of claim 23 wherein the magnet array and the coil array are operable to provide a torque between the coil array and the magnet array about the first and second directions.

25. The exposure apparatus of claim 13 wherein the coil array is connected to the base and the magnet array is connected to the stage for movement therewith relative to the base and the coil array.

26. A device manufactured with the exposure apparatus of claim 13.

27. A wafer on which an image has been formed by the exposure apparatus of claim 13.

* * * * *